US006562682B1

(12) United States Patent
Chiu et al.

(10) Patent No.: US 6,562,682 B1
(45) Date of Patent: May 13, 2003

(54) METHOD FOR FORMING GATE

(75) Inventors: Hung-Yu Chiu, Kaohsiung (TW);
Ming-Shang Chen, Hsinchu (TW);
Uway Tseng, Taichung (TW)

(73) Assignee: Macronix International Co., Ltd.,
Hsinchu (TW)

( * ) Notice: Subject to any disclaimer, the term of this patent is extended or adjusted under 35 U.S.C. 154(b) by 0 days.

(21) Appl. No.: 10/065,031

(22) Filed: Sep. 12, 2002

(51) Int. Cl.⁷ .................................... H01L 21/336
(52) U.S. Cl. ...................................... 438/257
(58) Field of Search .......................... 438/257–267, 438/585, 592–594

(56) References Cited

U.S. PATENT DOCUMENTS 5,907,775 A * 5/1999 Tseng ........................ 438/261
5,923,976 A * 7/1999 Kim ........................... 438/261
6,194,300 B1 * 2/2001 Hung et al. ................ 438/593
6,271,090 B1 * 8/2001 Huang et al. .............. 438/264

* cited by examiner

*Primary Examiner*—Richard Booth
(74) *Attorney, Agent, or Firm*—Jiang Chyun IP Office

(57) ABSTRACT

The invention provides a method for forming a semiconductor gate, by forming spacers to isolate the interface between the HDP dielectric layer and the polysilicon gate being exposed, thereby preventing single bit failure resulting from defects at the interface between the HDP dielectric layer and the polysilicon gate. After a cap layer is formed on a conductive structure over the substrate, a HDP dielectric layer is formed exposing the cap layer. A top of the HDP dielectric layer is higher than a top of the first conductive layer. After removing the cap layer to form a recess between the HDP dielectric layer and on the conductive structure, spacers are formed on sidewalls of the recess. Afterwards, a conductive layer is formed and connected to the conductive structure.

20 Claims, 5 Drawing Sheets

METHOD FOR FORMING GATE

BACKGROUND OF INVENTION

1. Field of Invention

The present invention relates to a method for forming semiconductor devices.

More particularly, the present invention relates to a method for forming a semiconductor gate.

2. Description of Related Art

In the semiconductor manufacture processes, a method for forming gates without using chemical mechanical polishing (CMP) for planarization has been proposed. Because the CMP process is not required, the gate-forming method is more cost-efficient and environmental friendly. In the gate-forming method, a cap layer is formed on the gate electrode and a high density plasma (HDP) oxide layer is deposited over the substrate and between the gate electrodes. A portion of the HDP oxide layer is removed by HF until the cap layer is exposed. During the step of removing the cap layer, the extra HDP oxide layer on the gate is also removed to obtain a HDP oxide layer with a planar surface. As the device dimension shrinks, the line-widths for the gates become shorter in order to maintain the lengths of channels. Therefore, a wider polysilicon layer is formed at an upper portion of the gate to increase the upper surface, thereby increasing the process window and reducing the resistance.

Following the prior art processes, defects formed at the interface between the HDP oxide layer and the gate can cause through holes down to the substrate if misalignment occurs during forming the wider polysilicon layer, which results in single bit failure and deteriorates reliability. Such failures suffering from misalignment and decreased distances between gates further reduce the gate coupling ratio (GCR).

SUMMARY OF INVENTION

The present invention provides a method for forming a semiconductor gate, which can prevent single bit failure resulting from defects at the interface between the HDP dielectric layer and the polysilicon gate.

Accordingly, the present invention provides a method for forming a semiconductor gate, which can increase reliability and increase gate coupling ratio.

Moreover, the method of the present invention relates to a method for forming a semiconductor gate, which can provide larger misalignment window for the photolithography process toward defining the gate.

As embodied and broadly described herein, the invention provides a method for forming a semiconductor gate. Because the oxide spacers (or the remained oxide layer) located on sidewalls of the recess can isolate the interface between the HDP dielectric layer and the polysilicon gate being exposed, thereby preventing single bit failure resulting from defects at the interface between the HDP dielectric layer and the polysilicon gate. Therefore, reliability of the memory is enhanced. Moreover, since the oxide spacer (or the remained oxide layer) protects a portion of the underlying conductive layer, the misalignment window for defining the gate can be enlarged.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention relates to a method for forming a semiconductor gate by using a buried oxide spacer, to solve problems causing from defects of the HDP dielectric layer. The method of the present invention is applicable for various semiconductor manufacture processes, including processes for mask read only memory (mask ROM), flash memory or buried bit line, for example. In the following embodiments, processes for forming the floating gate of a flash memory is taken as an example.

FIGS. 1A–1E are cross-sectional views of the manufacturing process for a floating gate of the flash memory according to one preferred embodiment of this invention.

Figure 1A:
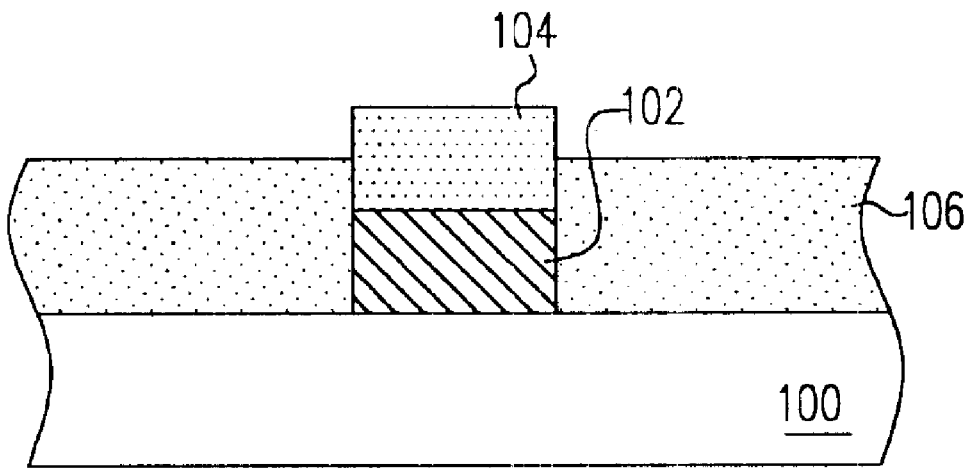
FIGS. 1A–1E are cross-sectional views of the manufacturing process for a floating gate of the flash memory according to one preferred embodiment of this invention.

Referring to FIG. 1A, a semiconductor substrate 100 is provided. The substrate 100 has at least a stacked structure including a first conductive layer 102 and a cap layer 104. The first conductive layer 102 is, for example, a polysilicon layer. The cap layer 104 is, for example, a silicon nitride ($Si_3N_4$) layer. A tunnel oxide layer (not shown) is further included between the first conductive layer 102 and the substrate 100. A HDP dielectric layer 106 is formed over the substrate 100, while the cap layer 104 is exposed. A top of the HDP dielectric layer 106 is higher than a top of the first conductive layer 102. The HDP dielectric layer is, for example, a HDP oxide layer. The method for forming the HDP dielectric layer, for example, including forming a HDP dielectric layer over the substrate 100 completely covering the cap layer 104 and then using HF to remover a portion of the HDP dielectric layer to expose the cap layer 104.

Figure 1B:
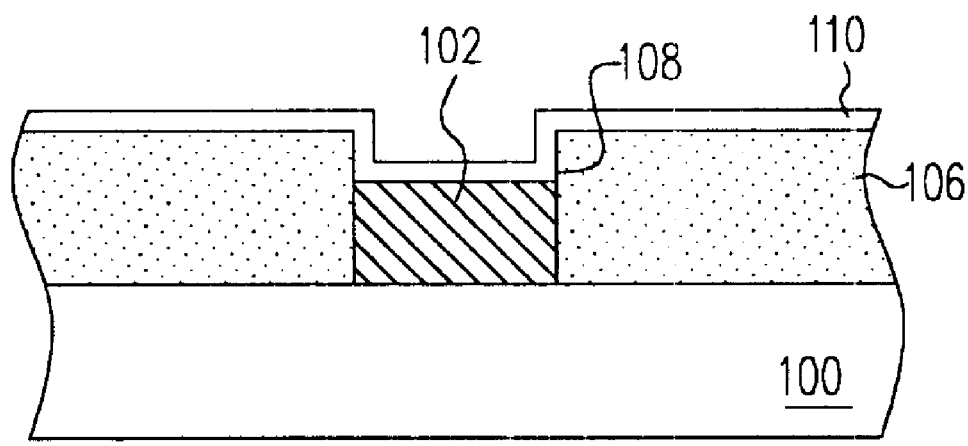

Referring to FIG. 1B, the cap layer 104 is removed by, for example, wet etching. If the cap layer is a silicon nitride layer, then hot phosphoric acid is used to remove the cap layer, for example. Because the top of the HDP dielectric layer 106 is higher than the top of the first conductive layer 102, a recess 108 is formed between the HDP dielectric layer 106 and on the first conductive layer 102 after the cap layer is removed. Next, an oxide layer 110 is formed over the substrate 100 to cover the recess 108. For example, the oxide layer 110 is a HDP oxide layer.

Figure 1C:
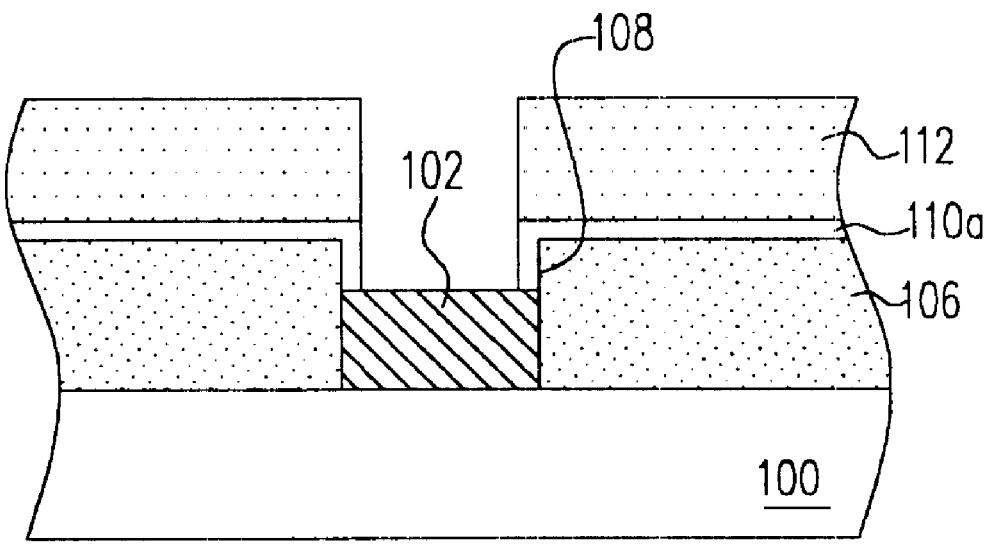

Referring to FIG. 1C, a patterned photoresist layer 112 is formed over the substrate. Using the patterned photoresist layer 112 as an etching mask, the oxide layer 110 is etched to expose the first conductive layer 102, leaving the oxide layer 110a on sidewalls of the recess 108.

Figure 1D:
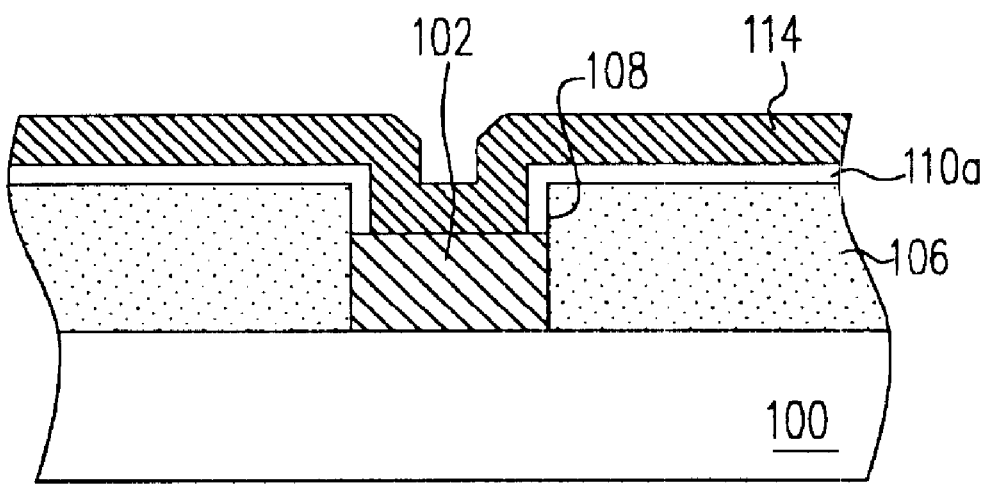

Referring to FIG. 1D, the patterned photoresist layer 112 is removed. A second conductive layer 114 is deposited over the substrate 100 to cover the recess 108 and the remained oxide layer 110a, so that the second conductive layer 114 is connected with the underlying first conductive layer 102. The connected conductive layers become a floating gate for the flash memory, thus increasing the upper surface of the gate. The second conductive layer 114 is made of, for example, polysilicon.

Figure 1E:
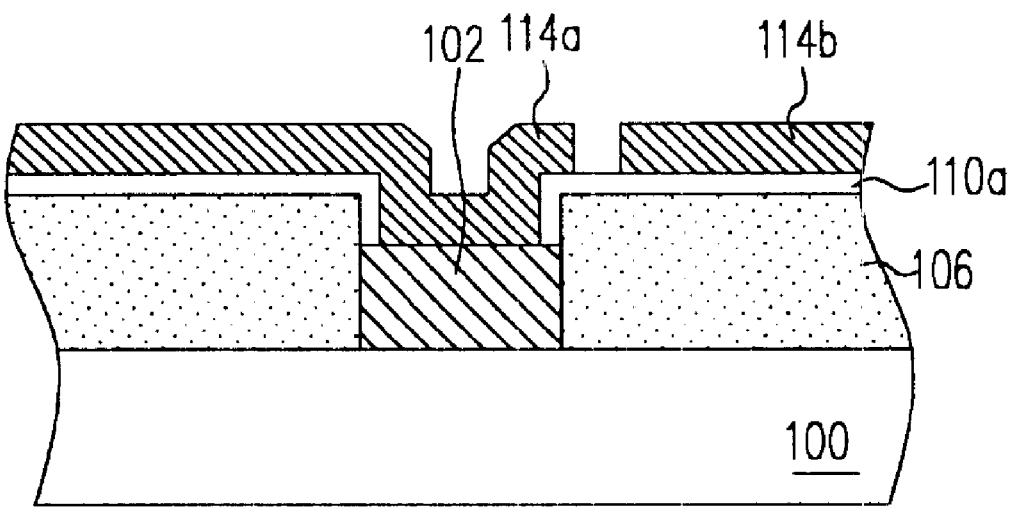

Referring to FIG. 1E, the second conductive layer 114 is defined to form patterned conductive layers 114a, 114b. The patterned conductive layer 114a is connected to the underlying first conductive layer 102 and the connected conductive layers become a floating gate for the flash memory, thus increasing the upper surface of the gate. The other patterned conductive layer 114b becomes a floating gate for another flash memory. In the present invention, because of the protection of the remained oxide layer 110a, the misalignment window for defining the second conductive layer 114 is greatly increased, compared with the prior art. Accordingly, the floating gate of the present invention has an increased gate coupling ratio (GCR).

FIGS. 2A–2E are cross-sectional views of the manufacturing process for a floating gate of the flash memory according to another preferred embodiment of this invention.

Figure 2A:
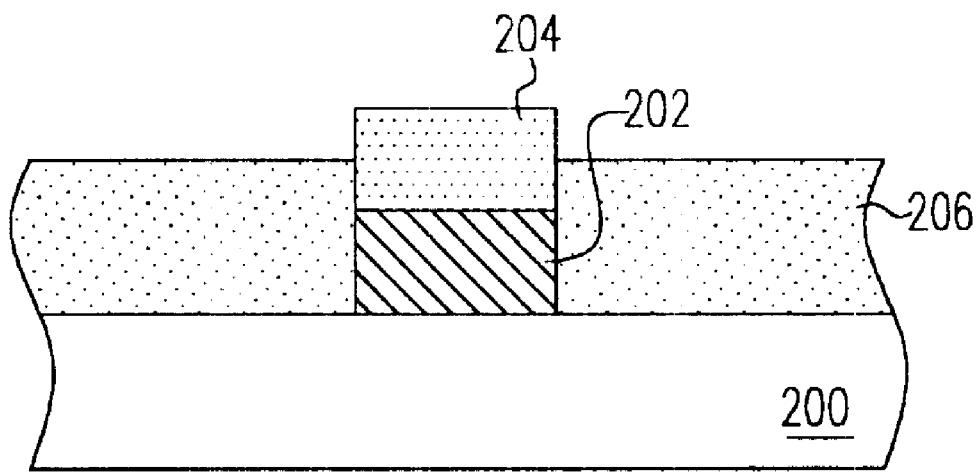
FIGS. 2A–2E are cross-sectional views of the manufacturing process for a floating gate of the flash memory according to another preferred embodiment of this invention.

Referring to FIG. 2A, a semiconductor substrate 200 is provided. The substrate 200 has at least a stacked structure including a first conductive layer 202 and a cap layer 204. The first conductive layer 202 is, for example, a polysilicon layer. The cap layer 204 is, for example, a silicon nitride layer. A tunnel oxide layer (not shown) is further included between the first conductive layer 202 and the substrate 200. A HDP dielectric layer 206 is formed over the substrate 200, while the cap layer 204 is exposed. A top of the HDP dielectric layer 206 is higher than a top of the first conductive layer 202. The HDP dielectric layer is made of, for example, silicon oxide.

Figure 2B:
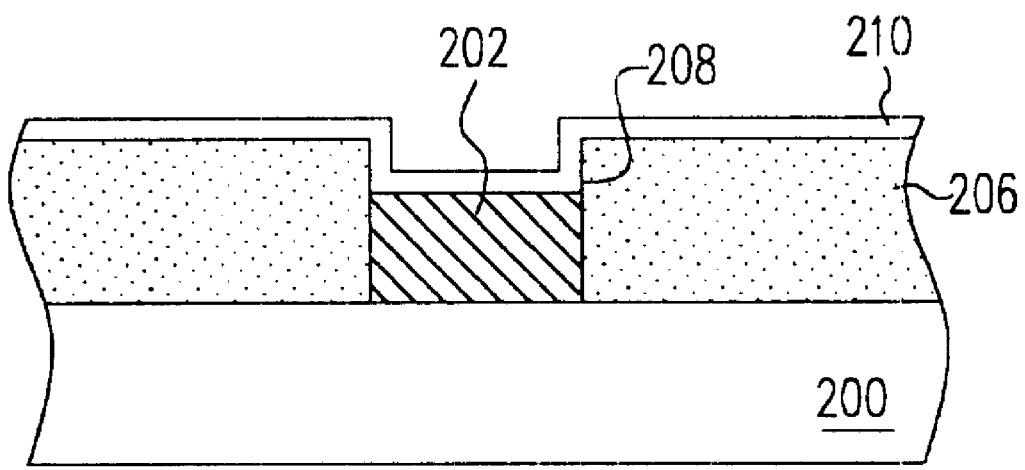

Referring to FIG. 2B, the cap layer 204 is removed by, for example, hot phosphoric acid. Because the top of the HDP dielectric layer 206 is higher than the top of the first conductive layer 202, a recess 208 is formed between the HDP dielectric layer 206 and the first conductive layer 202 after the cap layer is removed. Next, an oxide layer 210 is formed over the substrate 200 to cover the recess 208. For example, the oxide layer 210 is a HDP oxide layer.

Figure 2C:
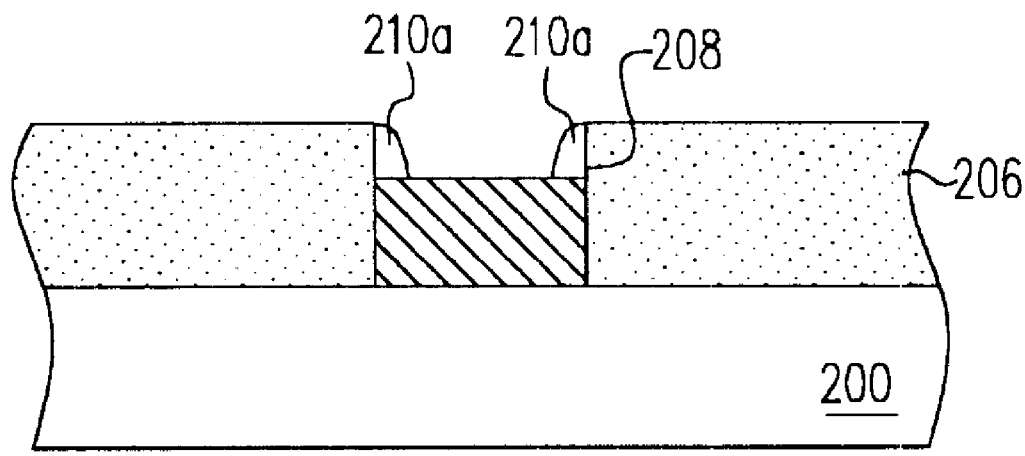

Referring to FIG. 2C, an etching back process is performed to the oxide layer 210, so that an oxide spacer 210a is formed on sidewalls of the recess 208 and the first conductive layer 202 is exposed.

Figure 2D:
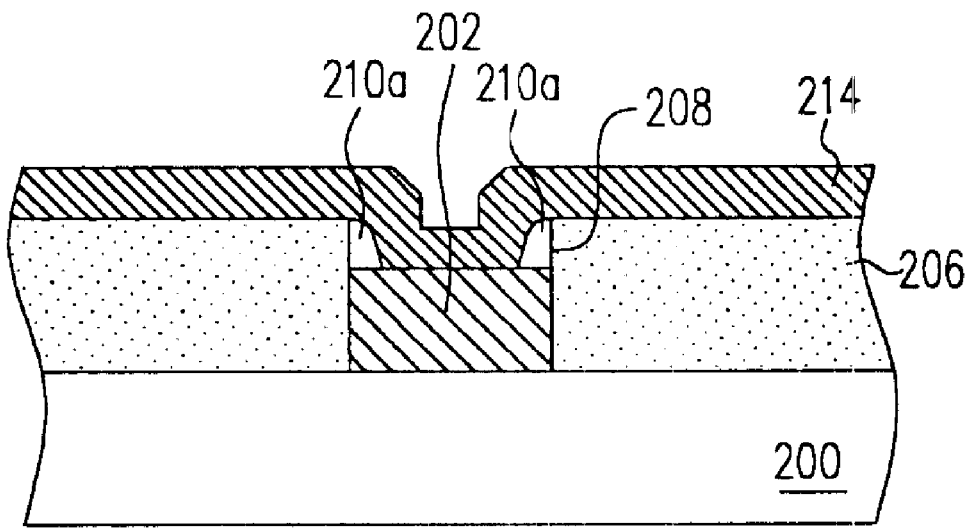

Referring to FIG. 2D, a second conductive layer 214 is deposited over the substrate 200 to cover the recess 208 and the oxide spacer 210a, so that the second conductive layer 214 is connected with the underlying first conductive layer 202. The connected conductive layers become a floating gate for the flash memory, thus increasing the upper surface of the gate. The second conductive layer 214 is made of, for example, polysilicon.

Figure 2E:
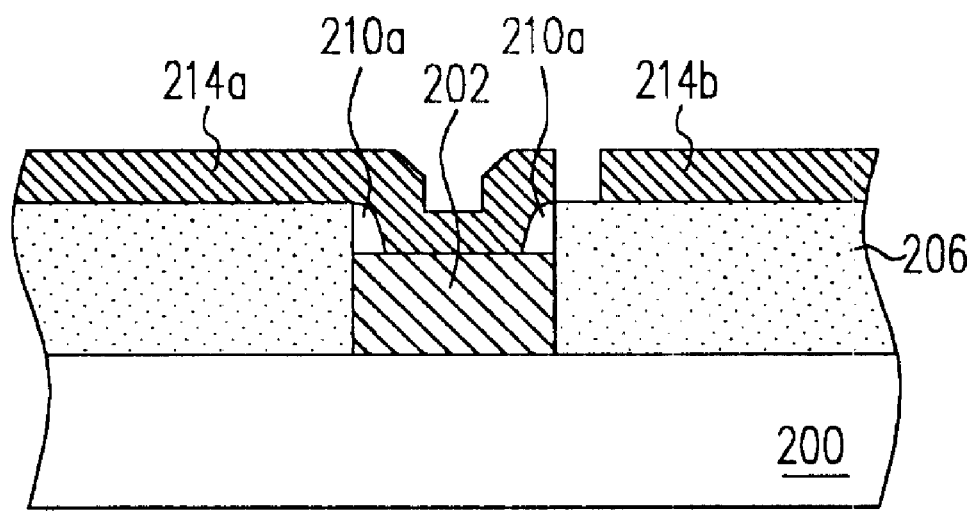

Referring to FIG. 2E, the second conductive layer 214 is defined to form patterned conductive layers 214a, 214b. The patterned conductive layer 214a is connected to the underlying first conductive layer 202 and the connected conductive layers become a floating gate for the flash memory, thus increasing the upper surface of the gate. The other patterned conductive layer 214b becomes a floating gate for another flash memory. In the present invention, because of the protection of the oxide spacer 210a, the misalignment window for defining the second conductive layer 214 is greatly increased, compared with the prior art. Accordingly, the floating gate of the present invention has an increased gate coupling ratio (GCR).

In conclusion, the present invention is characterized in:
1. The oxide spacer (or the remained oxide layer) located on sidewalls of the recess can isolate the interface between the HDP dielectric layer and the polysilicon gate being exposed, thereby preventing single bit failure resulting from defects at the interface between the HDP dielectric layer and the polysilicon gate. Therefore, reliability of the memory is enhanced.
2. Because the oxide spacer (or the remained oxide layer) protects a portion of the underlying conductive layer, the misalignment window for defining the gate can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A method for forming a semiconductor gate, comprising:
   providing a substrate, wherein the substrate has a stacked structure comprising a first conductive layer and a cap layer;
   forming a high density plasma (HDP) dielectric layer over the substrate, while the cap layer is exposed, wherein a top of the HDP dielectric layer is higher than a top of the first conductive layer;
   removing the cap layer to form a recess between the HDP dielectric layer and on the first conductive layer;
   forming an oxide spacer on sidewalls of the recess; and
   forming a second conductive layer over the substrate to cover the recess so that the first conductive layer is connected to the second conductive layer.
2. The method as claimed in claim 1, wherein materials for forming the first and the second conductive layers include polysilicon.
3. The method as claimed in claim 1, wherein materials for forming the cap layer includes silicon nitride.
4. The method as claimed in claim 3, wherein removing the cap layer comprises using hot phosphoric acid.
5. The method as claimed in claim 1, wherein the HDP dielectric layer includes a HDP oxide layer.
6. The method as claimed in claim 5, wherein forming the HDP dielectric layer comprises:
   forming a HDP oxide layer over the substrate to cover the cap layer; and
   using HF to remove a portion of the HDP oxide layer to expose the cap layer.
7. A method for forming a floating gate for a flash memory, comprising:
   providing a substrate, wherein the substrate has a stacked structure comprising a first conductive layer and a cap layer;
   forming a high density plasma (HDP) dielectric layer over the substrate, while the cap layer is exposed, wherein a top of the HDP dielectric layer is higher than a top of the first conductive layer;
   removing the cap layer to form a recess between the HDP dielectric layer and on the first conductive layer;
   forming an oxide layer to cover the recess;
   defining the oxide layer to expose the cap layer, leaving a portion of the oxide layer on sidewalls of the recess; and
   forming a second conductive layer over the substrate to cover the recess so that the first conductive layer is connected to the second conductive layer.
8. The method as claimed in claim 7, further comprising defining the second conductive layer to form a plurality of floating gates after forming the second conductive layer.

9. The method as claimed in claim 7, wherein materials for forming the first and the second conductive layers include polysilicon.

10. The method as claimed in claim 7, wherein materials for forming the cap layer includes silicon nitride.

11. The method as claimed in claim 10, wherein removing the cap layer comprises using hot phosphoric acid.

12. The method as claimed in claim 7, wherein the HDP dielectric layer includes a HDP oxide layer.

13. The method as claimed in claim 12, wherein forming the HDP dielectric layer comprises:

forming a HDP oxide layer over the substrate to cover the cap layer; and using HF to remove a portion of the HDP oxide layer to expose the cap layer.

14. A method for forming a floating gate for a flash memory, comprising:

forming a conductive structure on a substrate;

forming a cap layer on the conductive structure;

forming a high density plasma (HDP) dielectric layer over the substrate, while the cap layer is exposed, wherein a top of the HDP dielectric layer is higher than a top of the conductive structure;

removing the cap layer to form a recess between the HDP dielectric layer and on the conductive structure;

forming an oxide spacer on sidewalls of the recess; and forming a conductive layer over the substrate to cover the recess so that the conductive structure is connected to the conductive layer.

15. The method as claimed in claim 14, further comprising defining the conductive layer to form a plurality of floating gates after forming the conductive layer.

16. The method as claimed in claim 14, wherein materials for forming the conductive structure and the conductive layer include polysilicon.

17. The method as claimed in claim 14, wherein forming the oxide spacer on sidewalls of the recess comprises:

forming an oxide layer over the substrate; and performing etching back to the oxide layer.

18. The method as claimed in claim 14, wherein the HDP dielectric layer includes a HDP oxide layer.

19. The method as claimed in claim 14, wherein materials for forming the cap layer includes silicon nitride.

20. The method as claimed in claim 19, wherein removing the cap layer comprises using hot phosphoric acid.

* * * * *